United States Patent
Nishikido

(12) 
(10) Patent No.: US 7,431,038 B2
(45) Date of Patent: Oct. 7, 2008

(54) WET PROCESSING DEVICE AND WET PROCESSING METHOD

(75) Inventor: Shuuichi Nishikido, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/579,979

(22) PCT Filed: Mar. 31, 2005

(86) PCT No.: PCT/JP2005/006260
§ 371 (c)(1),
(2), (4) Date: Nov. 9, 2006

(87) PCT Pub. No.: WO2005/117081
PCT Pub. Date: Dec. 8, 2005

(65) Prior Publication Data
US 2007/0221253 A1  Sep. 27, 2007

(30) Foreign Application Priority Data
May 28, 2004  (JP) .............................. 2004-160078

(51) Int. Cl.
*B08B 3/02* (2006.01)
(52) U.S. Cl. .................. 134/95.1; 134/198; 134/902
(58) Field of Classification Search ............ 134/21, 134/26, 33, 36, 37, 95.1, 198, 902
See application file for complete search history.

(56) References Cited

U.S. PATENT DOCUMENTS

2001/0037858 A1   11/2001   Taniyama (Continued)

FOREIGN PATENT DOCUMENTS

JP   2903284   3/1999

(Continued)

OTHER PUBLICATIONS

Notification of Transmittal of Copies of Translation of the International Preliminary Report on Patentability (Form PCT/IB/338)—PCT/JP2005/006260, dated Jan. 2004.

(Continued)

*Primary Examiner*—Frankie L Stinson
(74) *Attorney, Agent, or Firm*—Smith, Gambrell & Russell, LLP

(57) ABSTRACT

The flow of a processing liquid poured onto the surface of a substrate at a standstill to process the substrate from the surface to the back surface of the substrate is suppressed to achieve satisfactory cleaning.

When a processing liquid is poured onto a substrate held in a horizontal position by a substrate holding unit to carryout a predetermined process, for example, a cleaning liquid is discharged through a discharge opening corresponding to the entire circumference of the back surface of the substrate before pouring the processing liquid onto the surface of the substrate, and the cleaning liquid discharged on the back surface of the substrate and a liquid flowing from the surface to the back surface of the substrate are sucked through a suction opening corresponding to the entire circumference of the back surface of the substrate and included in a first suction means. Thus an outward flow of the cleaning liquid is produced on the back surface of the substrate. For example, the flow of the liquid from the surface to the back surface of the substrate can be suppressed without resorting to a shake-off action resulting from rotation and, consequently, the substrate can be satisfactorily cleaned.

17 Claims, 13 Drawing Sheets

U.S. PATENT DOCUMENTS

2002/0195128 A1   12/2002   Shibagaki

FOREIGN PATENT DOCUMENTS

| | | |
|---|---|---|
| JP | 3198377 | 6/2001 |
| JP | 2001-319849 | 11/2001 |
| JP | 2003-007664 | 1/2003 |
| JP | 2004-022783 | 1/2004 |

OTHER PUBLICATIONS

PCT International Preliminary Report on Patentability (Form PCT/IB/373)—PCT/JP2005/006260, dated Jan. 2004.

Translation of PCT Written Opinion of the International Searching Authority—(Form PCT/ISA/237)—PCT/JP2005/006260, dated Jan. 2004.

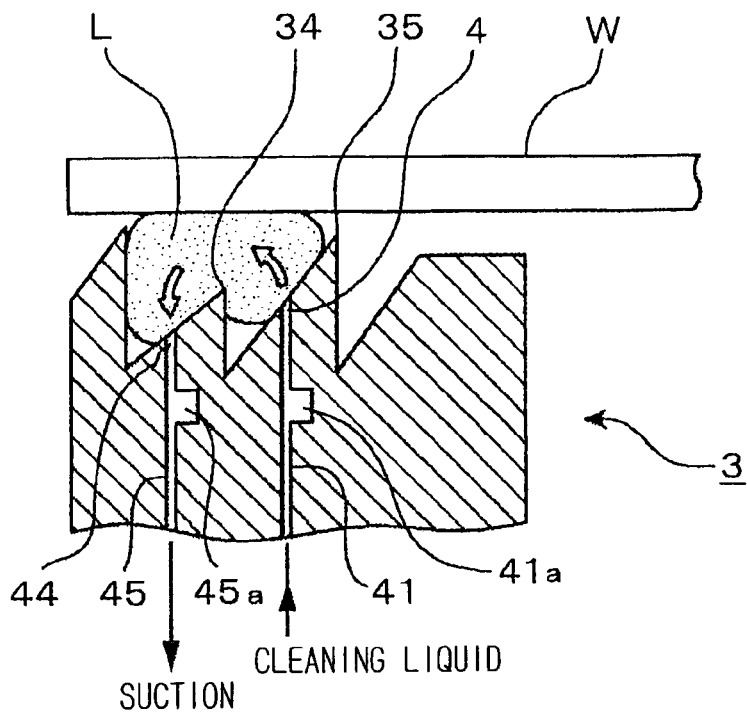
F I G. 7
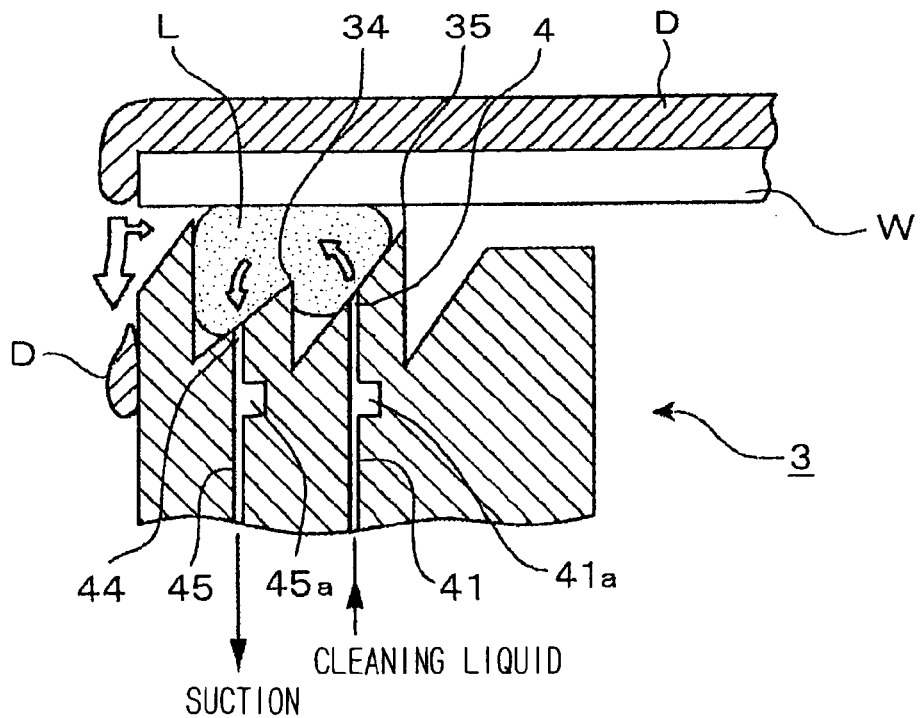
F I G. 8

WET PROCESSING DEVICE AND WET PROCESSING METHOD

TECHNICAL FIELD

The present invention relates to a wet processing device for and a wet processing method of processing a substrate having, for example, a surface coated with a resist and processed by an exposure process by a predetermined process using a processing liquid, such as a developer.

BACKGROUND ART

A photoresist pattern forming process, i.e., one of semiconductor device manufacturing processes, forms a thin resist film on a surface of a semiconductor wafer (hereinafter, referred to simply as "wafer"), exposes the resist film to transfer a predetermined circuit pattern to the resist film and develops the circuit pattern by processing the exposed resist film with a developer, namely, a processing liquid, to form a mask pattern on the surface of the wafer. Usually, these processes are carried out by a system built by connecting an exposure system to a coating and developing system that forms a resist film and develops the exposed resist film.

A known developing process is carried out in the following manner. For example, as shown in FIG. 14(a), a wafer W is held in a horizontal position on a spin chuck 1 capable of rotating about a vertical axis. A developer D is discharged onto the surface of the wafer W through, for example, a developer nozzle 11 provided with a straight discharge opening of a length equal to the diameter of the wafer W while the developer nozzle 11 is moved in a horizontal plane extending slightly above the surface of the wafer 11 to develop the wafer W. Subsequently, as shown n FIG. 14(b), the wafer W is rotated about a vertical axis and a rinsing liquid R, such as pure water, is poured onto a central part of the surface of the wafer W through an upper rinsing nozzle 12 and onto a peripheral part of the back surface of the wafer W through a lower rinsing nozzle 13. The rinsing liquid R is forced to spread over the entire surface of the wafer W and the entire peripheral part of the back surface of the wafer W by centrifugal force acting on the rinsing liquid R while the wafer W is rotating to clean the wafer W. Then, as shown in FIG. 14(c), the wafer W is rotated at a high rotating speed to dry the wafer W by spin drying that shakes the rinsing liquid R off the wafer W.

When the developer D is poured onto the surface of the wafer W, the surface tension of the developer D spreads the developer D through the circumferential surface of the wafer W to the back surface in some cases. A large cleaning mechanism is needed to remove the developer D spread radially inward on the back surface. A known liquid seal forming method forms a liquid film (liquid seal) on a peripheral part of the back surface of a wafer W to restrain the developer D from flowing through the circumferential side surface of the wafer W to the back surface. (Such liquid seal forming methods are disclosed in, for example, Patent documents 1 and 2.) The liquid seal forming method will be briefly described with reference to FIG. 15. A cylindrical wall 14 is space from the back surface of a wafer W by a small space. An annular groove or the like is formed in the upper end surface of the cylindrical wall 14. For example, the wafer W is rotated about a vertical axis and, for example, pure water is discharged in to the space between the back surface of the wafer W and the upper end surface of the cylindrical wall 14 through a lower rinsing nozzle 13 before a developer D is discharged onto the surface of the wafer W. Pure water is retained by surface tension in the entire space in a liquid seal 15 to restrain the developer D from flowing to the back surface of the wafer W.

Patent document 1: Specification of Jpn. Pat. No. 2903284 (Second embodiment, FIGS. 11 and 12)

Patent document 2: Specification of Jpn. Pat. No. 3198377 (Paragraph 0054, FIG. 1)

DISCLOSURE OF THE INVENTION

Problem to be Solved by the Invention

Large wafers W have been used in recent years. When a large wafer W is rotated as mentioned above to spread a rinsing liquid R over the surface of the wafer by centrifugal force and to dry the wafer by spin drying, the difference in circumferential speed between a central part and a peripheral part of the large wafer W is large. Consequently, cleaning efficiency and drying efficiency are not uniform in the surface, and it is possible that parts of a resist pattern in a peripheral part moving at a high circumferential speed collapse (pattern collapsing). Moreover, a large rotating mechanism is necessary to rotate a large wafer W and, for example, it is difficult to incorporate stacked developing units into a coating and developing system in some cases. The inventors of the present invention have been engaged in developing a method of cleaning and drying, for example, a wafer W held at a standstill. To carry out this method, a method of suppressing the flow of the developer D to the back surface by a liquid seal formed on the wafer held at a standstill is necessary.

The present invention has been made in view of such circumstances and it is therefore an object of the present invention to provide a wet processing device and a wet processing method capable of suppressing the flow of a processing liquid to the back surface of a substrate when the processing liquid is poured onto the surface of the substrate held at a standstill and of satisfactory cleaning the substrate.

Means for Solving the Problem

A wet processing device according to the present invention includes: a substrate holding device for holding a substrate in a horizontal position; a processing liquid pouring unit for pouring a processing liquid onto a surface of a substrate held by the substrate holding device; a cleaning liquid pouring nozzle for pouring a cleaning liquid onto the surface of the substrate held by the substrate holding device and processed by a wet process that pours the processing liquid onto the surface of the substrate; a cleaning liquid discharging unit provided with a discharge opening extending along the entire circumference of the substrate to discharge a cleaning liquid on a peripheral part of the back surface of the substrate held by the substrate holding device; and a first suction means provided with a suction opening extending along the entire circumference of the substrate to suck the cleaning liquid discharged on the peripheral part of the back surface of the substrate by the cleaning liquid discharging unit to produce a flow of the cleaning liquid flowing outward or inward along the back surface of the substrate so as to suck the liquid flowing from the surface to the back surface of the substrate together with the flow of the cleaning liquid.

In the cleaning liquid discharging unit expressed by "a cleaning liquid discharging unit provided with a discharge opening extending along the entire circumference of the substrate", the discharge opening is formed such that the cleaning liquid discharged through the discharge opening toward a peripheral part of the substrate held at a standstill can entirely wet the peripheral part. More concretely, when the substrate is, for example, a wafer, the discharge opening is a circular slit concentric with the wafer or a circular ring of a plurality of discharge holes arranged at short intervals of 30 mm or below. In the first suction means, an expression "a suction opening extending along the entire circumference of the substrate" signifies a suction opening capable of sucking the cleaning liquid discharged on the peripheral part of the back surface of the substrate by the cleaning liquid discharging unit so as to form a flow of the cleaning liquid flowing outward or inward along the back surface of the substrate. The suction opening is a circular slit or a circular arrangement of a plurality of suction holes arranged at short intervals of 30 mm or below.

In a mode of operation of the present invention, the wet processing device is provided with a gas blowing unit for blowing a drying gas against the back surface of the substrate after the cleaning liquid discharging unit has stopped discharging the cleaning liquid. The wet processing device is provided with a controller for controlling the cleaning liquid discharging unit and the first suction mans so that a flow of the cleaning liquid may be formed while the processing liquid is being poured onto the surface of the substrate and while the cleaning liquid is being poured onto the surface of the substrate.

Further modes of operation of the present invention will be enumerated. An overflow ridge higher than the discharge opening and the suction opening is formed between the cleaning liquid discharge opening of the cleaning liquid discharging unit and the suction opening of the first suction means, and a liquid flow in a space between the overflow ridge and the back surface of thee substrate serves as a seal. The cleaning liquid discharging unit corresponds to a part of the substrate inner than a part of the substrate corresponding to the first suction means, and the cleaning liquid flows radially outward.

When the cleaning liquid flows radially outward, it is preferable that the wet processing device further includes a second suction means disposed at a position corresponding to a part of the substrate outer than the parts of the substrate respectively corresponding to the cleaning liquid discharging unit and the first suction means to suck a liquid dripped from the surface of the substrate, a part, on the side of the suction opening, of a liquid guide area extending between the cleaning liquid discharge opening of the cleaning liquid discharging unit and the suction opening of the first suction means slopes down toward the suction opening, and a member in contact with the cleaning liquid discharged by the cleaning liquid discharging unit has an inner part made of a hydrophobic material and an outer part made of a hydrophilic material.

The gas blowing unit may include a hollow structure circular in a plane, serving as the substrate holding device for holding a substrate by a central part thereof, defining a buffer chamber and provided with gas jetting holes arranged along the circumference of the hollow structure to jet the gas radially outward. The cleaning liquid discharge opening of the cleaning liquid discharging unit may be used also as the gas jetting holes. A stopping member for stopping the flow of a liquid from the surface to the back surface of the substrate may be disposed on the outer side of the cleaning liquid discharging unit and the first suction means.

A wet processing method according to the present invention includes the steps of: holding a substrate in a horizontal position; processing the substrate held at a standstill by a wet process that pours a processing liquid onto the surface of the substrate; pouring a cleaning liquid onto the surface of the substrate held at a standstill; and sucking a liquid flowing from the surface toward the back surface of the substrate together with a cleaning liquid by producing a flow of the cleaning liquid flowing outward or inward along the back surface of the substrate over the entire circumference of the substrate while the processing liquid is being poured onto the surface of the substrate and while the cleaning liquid is being poured onto the surface of the substrate. A state expressed by "the substrate is held at a standstill" includes a state where the substrate is being rotated at a rotating speed not high enough to shake the cleaning liquid off the substrate by centrifugal force lower than a rotating speed at which the substrate is rotated for spin cleaning to shake the cleaning liquid off the substrate by centrifugal force. Thus the state where the substrate is rotated at such a low rotating speed is technically equivalent to a state where the substrate is held at a standstill and is within the technical scope of the present invention.

According to the present invention, liquids flowing from the surface toward the back surface of the substrate are sucked together with the cleaning liquid by producing a flow of the cleaning liquid flowing outward or inward along the back surface of the substrate over the entire circumference of the substrate while the processing liquid is being poured onto the surface of the substrate and while the cleaning liquid is being poured onto the surface of the substrate. Therefore, the liquids (the processing liquid and the cleaning liquid containing the component of the processing liquid) merge into the outward or inward liquid flow.

BRIEF DESCRIPTION OF THE DRAWINGS

FIG. 7 is a view of assistance in explaining a mode of forming a liquid seal on the back surface of a wafer;

FIG. 8 is a view of assistance in explaining another back surface cleaning unit;

BEST MODE FOR CARRYING OUT THE INVENTION

Figure 1:
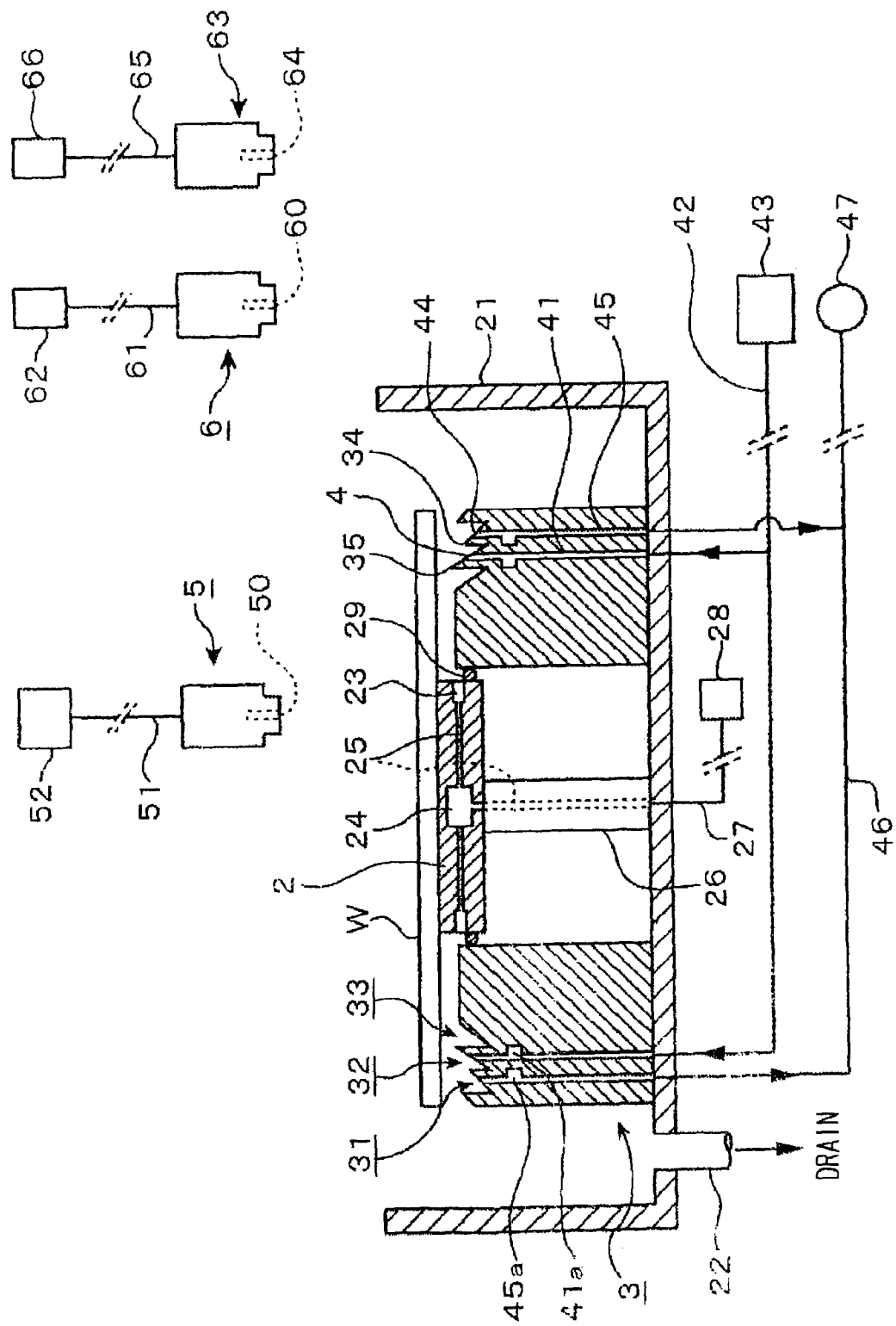
FIG. 1 is a longitudinal sectional view of a developing device in a preferred embodiment according to the present invention.
Figure 2:
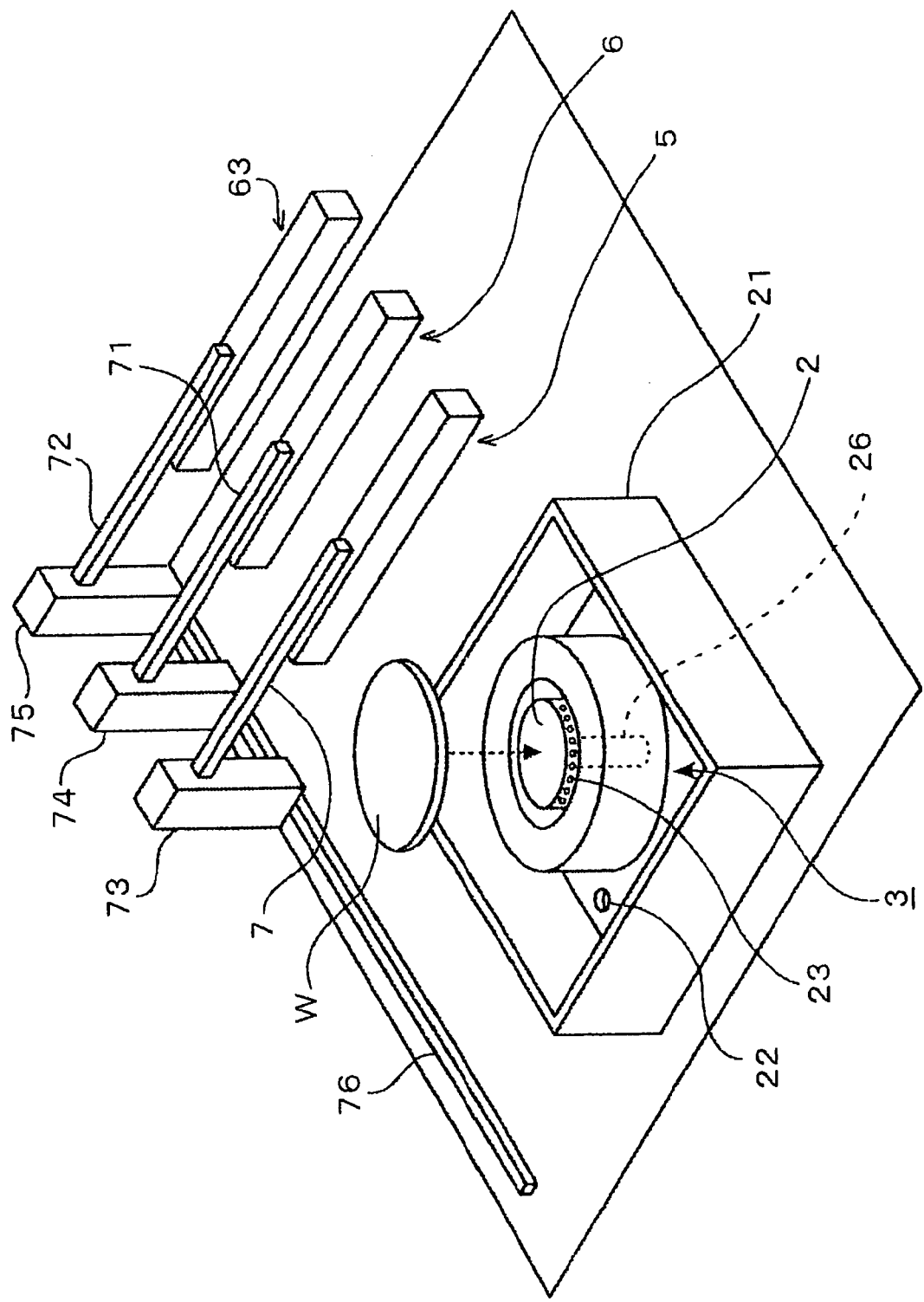
FIG. 2 is a perspective view of the developing device.

A wet processing device in a preferred embodiment according to the present invention will be described with reference to FIGS. 1 and 2. A developing device that wets a substrate with a developer, namely, a processing liquid for development will be described as an example of the wet processing device. In FIGS. 1 and 2, indicated at 2 is a vacuum chuck having a circular shape in a plane is a vertically movable substrate holding device for holding a substrate, for example, a wafer W, in a horizontal position. A suction hole, not shown, is formed in the surface of the vacuum chuck 2 to attract a central part of the back surface of the wafer W by suction to the vacuum chuck 2. The suction hole is connected to a suction means, such as a suction pump, not shown, by a suction line, not shown. The suction means produces a negative pressure in the suction hole to attract the back surface of the wafer W to the surface of the vacuum chuck 2.

A rectangular cup 21 serving as a sump is disposed so as to cover the side and the back surface of the wafer W held on the surface of the vacuum chuck 2. The cup 21 has a bottom wall provided with a drain hole through which drain, such as a developer and a rinsing liquid dripped from the wafer W, is discharged. Gas jetting holes 23 of a small diameter are formed in the circumferential side surface of the vacuum chuck 2. A drying gas, such as dry air or dry nitrogen gas, conditioned at a temperature and a humidity is jetted through the gas jetting holes 23 into a space between the back surface of the wafer W and s back surface cleaning device, which will be described later. The gas jetting holes 23 are arranged at short circumferential intervals of, for example, 8 mm or below. The gas jetting holes 23 communicate with a gas storage cavity 24 formed in, for example, a central part of the vacuum chuck 2 by means of passages 25. The gas storage cavity 24 is connected to one end of a gas supply line 27, such as a pipe, by a passage formed in, for example, a vertical chuck support member 26. The other end of the gas supply line 27 is connected to a drying gas source 28. The gas supply line 27 is provided with a flow regulator, not shown. In FIG. 1, indicated at 29 is a sealing member, such as an O ring, for preventing the leakage of the drying gas through a gap between the vacuum chuck 2 and a back surface cleaning device, which will be described later. In FIG. 2, the sealing member 29 is omitted for convenience.

An annular member 3 included in the back surface cleaning device is disposed below the wafer W held on the vacuum chuck 2. A space is formed between a peripheral part of the back surface of the wafer W and the annular member 3. The outer edge of the wafer W coincides with the outer circumference of the annular member 3 as viewed from above. Three circular grooves of a width, for example, between 1 and 5 mm are formed in the upper end surface of the annular member 3 in parts near the outer circumference of the upper end surface. The three circular grooves are concentric with the wafer W. In FIG. 2, the three circular grooves are omitted for convenience. The three circular grooves will be called an outer groove 31, a middle groove 32 and an inner groove 33. The outer edge of the outer groove 31 is at a distance between 1 and 5 mm from the outer circumference of the annular member 3. Thus an outer annular part of the upper end surface of the annular member 3 extending outside the outer groove has a width between 1 and 5 mm. The outer annular part slopes down outward. The thickness of a space between the upper end of the outer annular part and the back surface of the wafer W is, for example, between 0.1 and 3 mm.

Figure 3:
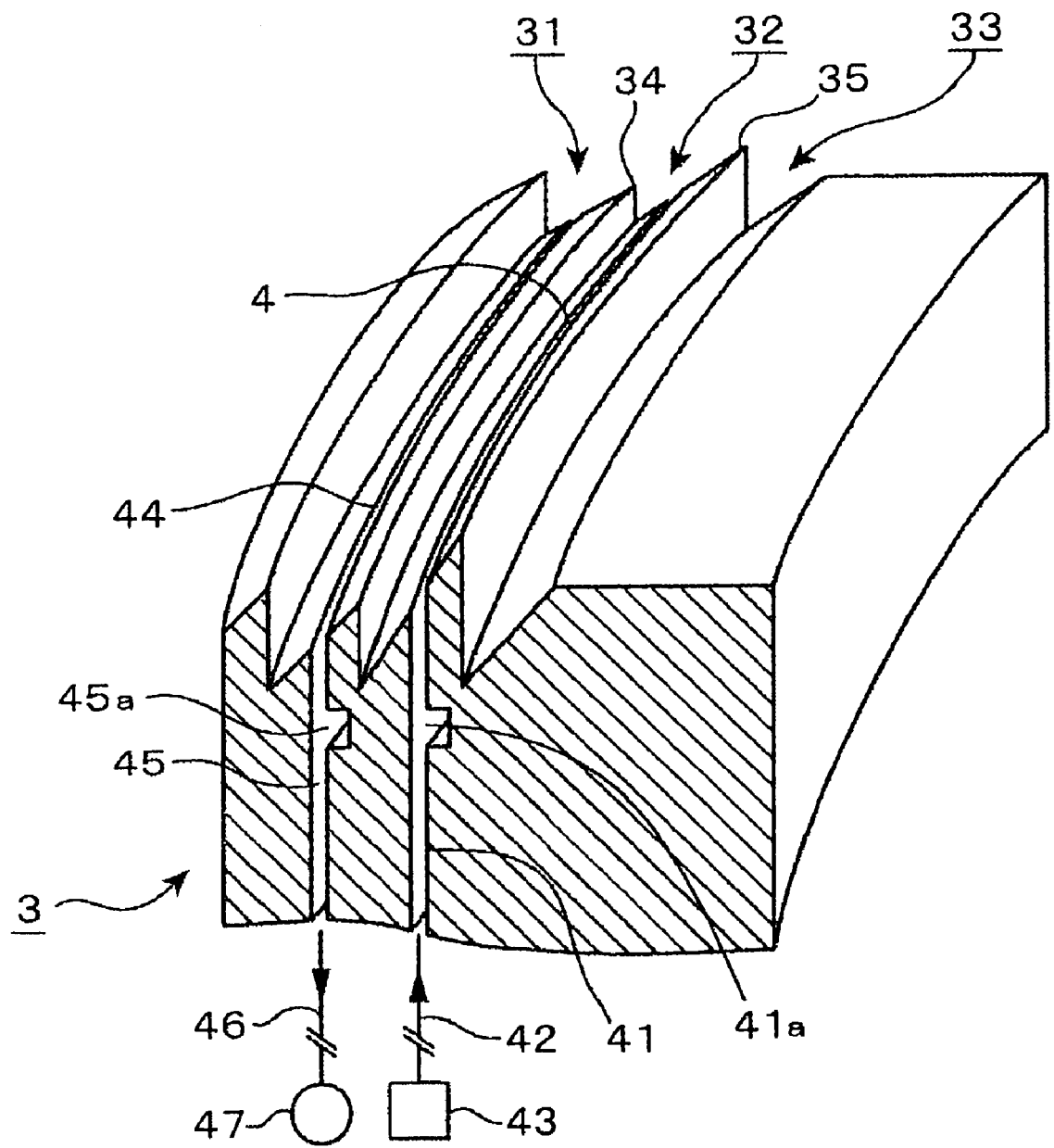
FIG. 3 is a view of assistance in explaining a back surface cleaning unit for the developing device.

The annular member 3 will be described with reference to FIG. 3. Each of the grooves 31 to 33 has a V-shaped cross section and is defined by a vertically standing outer side surface (vertical surface) and an inclined inner side surface (inclined surface) sloping down outward. A wall with a triangular cross section demarcating the grooves 31 and 32, and a wall with a triangular cross section demarcating the groove 32 and 33 are a first overflow ridge 34 and a second overflow ridge 35, respectively. The upper end of the second overflow ridge 35 is higher than the surface of the annular member 3. The distance between the upper end of the second overflow ridge 35 and the back surface f the wafer W is, for example, between 0.1 and 3 mm. The upper end of the first overflow ridge 34 is lower than that of the second overflow ridge 35 by a distance, for example between 0.5 and 2 mm and hence the distance between the upper end of the first overflow ridge 34 and the back surface of the wafer W is, for example, 0.5 and 3 mm. A space between a part of the upper end surface of the annular member 3 extending on the inner side of the inner groove 31 and the back surface of the wafer W serves as a passage for a drying gas jetted through the gas jetting holes 23 and a buffer for the drying gas. Thus the drying gas jetted through the gas jetting holes 23 can uniformly spread radially outward.

A circular discharge opening 4 having the shape of a circular slit of, for example, 1 mm in width is formed in, for example, the inclined surface sloping down outward of the middle groove 32. A cleaning liquid, such as pure water, serving also as sealing water for forming a liquid seal on the back surface of the wafer W is discharged through the discharge opening 4. The discharge opening 4 is included in a cleaning liquid discharging unit. The discharge opening 4 is connected to a passage 41 formed in the annular member 3 and is provided with a liquid reservoir 41a serving as a buffer. A supply line 42, such as a pipe, has one end connected to the passage 41 and the other end connected to a cleaning liquid source 43 and is provided with a flow regulator, not shown.

A circular suction opening 44 having the shape of a circular slit of, for example, 1 mm in width is formed in, for example, the inclined surface sloping down outward of the outer groove 31. The cleaning liquid discharged through the discharge opening 4, and the liquids, for example the developer and the rinsing liquid, that flow from the surface to the back surface of the wafer during wet processes are sucked through the suction opening 44. The suction opening 44 is on the outer side of the discharge opening 4 and extends along the peripheral edge of the wafer W. The suction opening 44 is connected to a passage 45 formed in the annular member 3 and is provided with a liquid reservoir 45a serving as a buffer. A suction line 46, such as a pipe, has one end connected to the passage 45 and the other end connected to a suction means 47, such as a suction pump or an ejector and is provided with a flow regulator, not shown.

At least the surface of the annular member 3 is formed of a hydrophobic material repellent to the cleaning liquid and chosen from, for example, polypropylene resins (PP resins), and fluorocarbon resins including tetrafluoroethylene perfluoroalkoxy ethylene resins (PFA resins) and polytetrafluoroethylene resins (PTFE resins). Being hydrophobic signifies, for example, that the contact angle between a surface of a material having a hydrophobic nature and the cleaning liquid is 50° or above. The surfaces of the outer groove 31 and the middle groove 32 in the upper end surface of the annular member 3 are finished, for example, by a surface treatment, such as plasma irradiation or UV irradiation, to provide those surfaces with a hydrophilic nature. Being hydrophilic signifies, for example, that the contact angle between a surface of a material having a hydrophilic nature and, for example, the cleaning liquid is 50° or below. Thus the upper end surface of the annular member 3 has a hydrophobic inner part, a hydrophilic middle part and a hydrophobic outer part. The hydrophobic outer part extending outside the outer groove 31 is a liquid stopping member for stopping the flow of the developer and the rinsing liquid into the space between the wafer W and the annular member 3, which will be described later.

Figure 4:
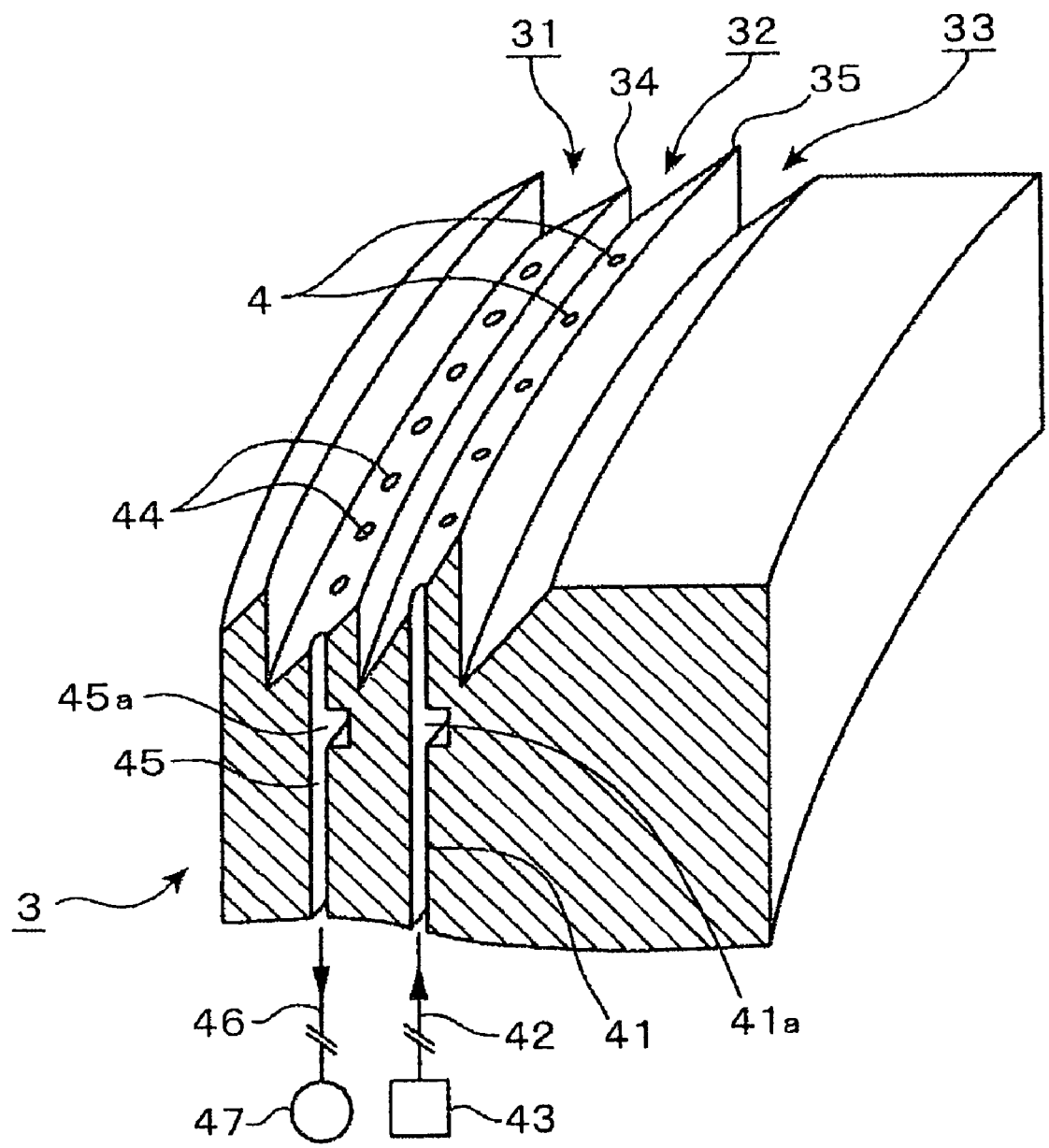
FIG. 4 a view of assistance in explaining another back surface cleaning unit for the developing device.

The discharge opening through which the cleaning liquid is discharged and the suction opening do not need necessarily to be circular slits. For example, a circular arrangement of a plurality of 0.5 mm diameter discharge holes 4 arranged at short intervals of 1 mm or below as shown in FIG. 4 may be used instead of the discharge opening, and a circular arrangement of a 2 mm diameter suction holes 44 arranged at short intervals of 10 mm or below as shown in FIG. 4 may be used instead of the suction opening.

Figure 5:
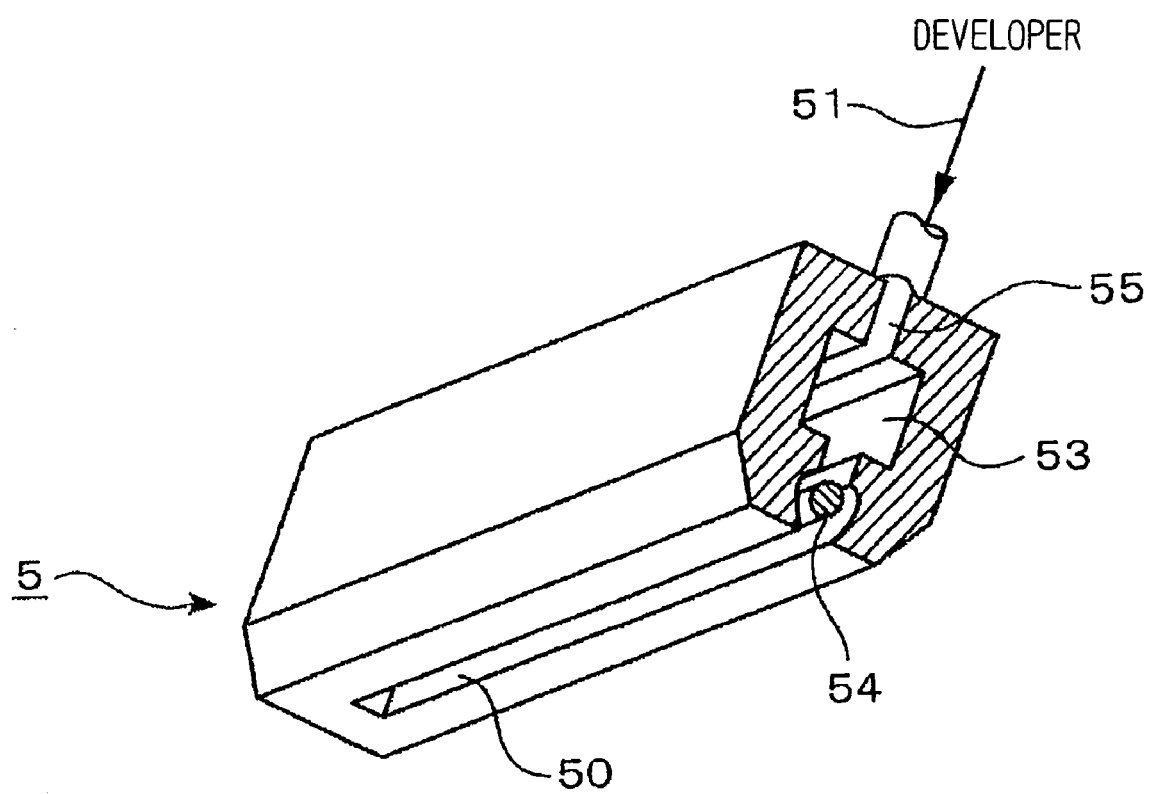
FIG. 5 is a view of assistance in explaining a developer pouring nozzle for the developing device.

Referring again to FIGS. 1 and 2, a vertically and horizontally movable developer pouring nozzle 5 for pouring the developer onto the wafer W is disposed opposite to and above the wafer W held by the vacuum chuck 2. The developer pouring nozzle 5 has a straight discharge opening 50 of a length equal to or longer than the width of an effective area, namely, a device forming area, of the wafer W. The straight discharge opening 50 may be a slit or a straight arrangement of a plurality of small discharge holes. A supply line 51, such as a pipe, has one end connected to the developer pouring nozzle 5 and the other end connected to a developer source 52 and is provided with a flow regulator. The developer pouring nozzle 5 provided with the discharge opening 50 in the shape of a slit will be described with reference to FIG. 5. The discharge opening 50 communicates with a liquid reservoir 53 formed in the developer pouring nozzle 5. An interference bar 54 for longitudinally uniformly distributing the developer is disposed between the developer pouring opening 50 and the liquid reservoir 53. The interference bar 54 is spaced from side surfaces defining the discharge opening 50. The liquid reservoir 53 is connected to an inlet port 55. The supply line ti is connected to the inlet port 55.

A rinsing liquid, such as pure water, serving as a cleaning liquid is poured through a rinsing liquid pouring nozzle 6 onto the surface of the wafer W, for example, after the wafer W has been processed by a developing process. The rinsing liquid pouring nozzle 6 is vertically movable and can be advanced to and retracted from a pouring position opposite the surface of the wafer W. The rinsing liquid pouring nozzle 6 is the same in shape as, for example, the developer pouring nozzle 5. The rinsing liquid pouring nozzle 6 has a straight discharge opening 60 of a length equal to or longer than the width of the effective area of the wafer W. A supply line 61, such as a pipe, has one end connected to the rinsing liquid pouring nozzle 6 and the other end connected to a rinsing liquid source 62 and is provided with a flow regulator, not shown.

A suction nozzle 63 sucks the rinsing liquid poured onto the surface of the wafer W through the rinsing liquid pouring nozzle 6 off the wafer W to dry the wafer W. The suction nozzle 63 is vertically movable and can be advanced to and retracted from a position opposite the surface of the wafer W. The suction nozzle 63 is the same in shape as, for example, the developer pouring nozzle 5. The suction nozzle 63 has a straight suction opening 64 of a length equal to or longer than the width of the effective area of the wafer W. A suction line 65, such as a pipe, has one end connected to the suction nozzle 63 and the other end connected to a suction means 66, such as a suction pump or an ejector and is provided with a vacuum regulator, not shown.

The developer pouring nozzle 5, the rinsing liquid pouring nozzle 6 and the suction nozzle 63 are held individually by nozzle arms 7, 71 and 72, respectively. The nozzle arms 7, 71 and 72 have base end parts connected to movable bases 73, 74 and 75, respectively, as shown in FIG. 2. The movable bases 73, 74 and 75 are provided with lifting mechanisms, not shown, to move the developer pouring nozzle 5, the rinsing liquid pouring nozzle 6 and the suction nozzle 63 individually vertically. The movable bases 73, 74 and 75 are mounted on a guide rail 76 parallel to a diameter extending in a Y-direction. Driving mechanisms, not shown, drive the movable bases 73, 74 and 75 for individual sliding movement along the guide rail 76, respectively. Although the movable bases 73, 74 and 75 are mounted on the single guide rail 76 in FIG. 2, guide rails may be laid specially for the movable bases 73, 74 and 75, respectively.

Through holes, not shown, are formed in the vacuum chuck 2 so as to open in the surface of the vacuum chuck 2 at positions not coinciding with the gas storage cavity 24 and the passages 25. For example, three substrate support pins are extended in the through holes so as to be projected out from and retracted into the through holes. The substrate support pins cooperate with an external wafer carrying means, not shown, to transfer a wafer between the vacuum chuck 2 and the wafer carrying means.

The developing device is provided with a controller, not shown. The controller is capable of controlling the operations of the suction means for producing a negative pressure in the vacuum holes of the vacuum chuck 2, the flow regulators for regulating the flows of the developer and the rinsing liquid, the suction regulator for regulating the suction of the suction nozzle 63, and the movable bases 73, 74 and 75, an operation for discharging the cleaning liquid through the discharge opening 4 and an operation for producing a negative pressure in the suction opening 44 by the suction means 47.

Description will be made of processes for coating the surface of a substrate, such as a wafer W, with a resist film and for developing a resist pattern after the resist film has been exposed with reference to FIG. 6. In a state where the nozzles 5, 6 and 63 are held at their home positions outside the cup 21, a wafer carrying means, not shown, carries a wafer W through a gate, not shown, into the developing device. The wafer carrying means places the wafer W at a position above the vacuum chuck 2. The substrate support pins cooperate with the wafer carrying means to transfer the wafer W from the wafer carrying means to the vacuum chuck 2. The wafer W is attracted to the surface of the vacuum chuck 2 by suction and is held in a horizontal position.

Figure 6:
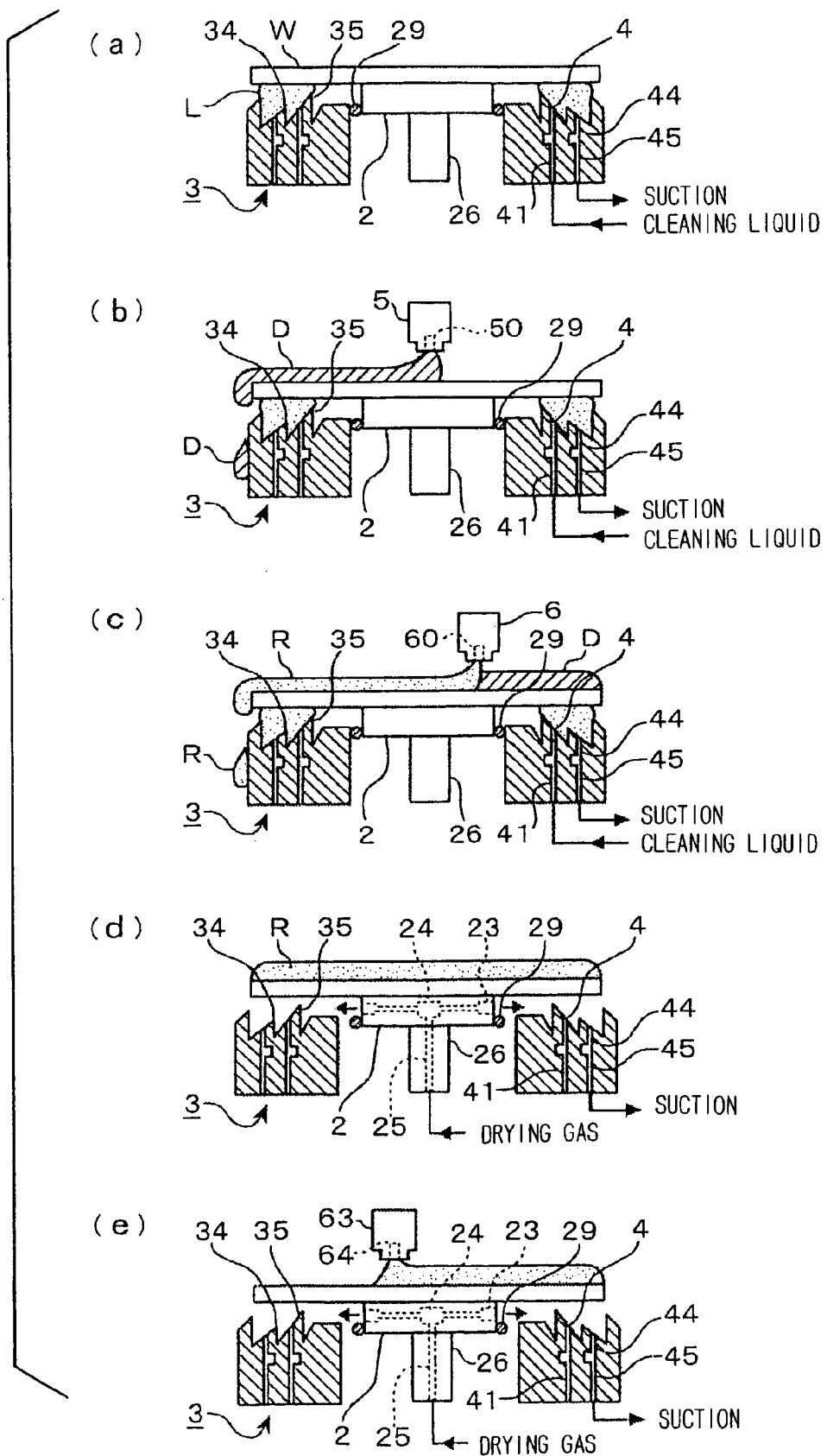
FIG. 6 is a view of assistance in explaining steps of a wafer developing process to be carried out by the developing device.

Subsequently, for example, as shown in FIG. 6(*a*), a cleaning liquid L, such as pure water, is discharged through the discharge opening 4 against a peripheral part of the back surface of the wafer W and, at the same time, the suction means 47 produces a negative pressure in the suction opening 44. The cleaning liquid L discharged against the wafer W flows outward along the back surface of the wafer W as typically shown in FIG. 7 by way of example. The cleaning liquid L overflows the first overflow ridge 31 and flows into the outer groove 31. Then, the cleaning liquid L is sucked through the suction opening 44 into the passage 45. Thus a radially outward liquid flow is produced over the entire peripheral part of the back surface of the wafer W to form a liquid seal (sealing part) of the cleaning liquid L is formed in the space between the peripheral part of the back surface of the wafer W and the first overflow ridge 34.

Then, the developer pouring nozzle 5 is positioned at a pouring starting position at a height, for example, between 0.1 and 5 mm from the surface of the wafer W and slightly outside the edge of the wafer W. Then, as shown in FIG. 6(*b*) by way of example, a developer D is discharged through the discharge opening 50 while the developer pouring nozzle 5 is driven for sliding (scanning) from a first end of the wafer W to a second end of the wafer W diametrically opposite the first end to form a liquid film of the developer D on the surface of the wafer W. Most of the developer D dripped from the wafer W drops along the outer circumference of the annular member 3 as typically shown in FIG. 8. A little part of the developer D dripped from the wafer W seeps into the space between the wafer W and the annular member 3 by, for example, capillary. The developer D seeped into the space is sucked together with the cleaning liquid L through the suction opening 44. A discharging operation for discharging the cleaning liquid L through the discharge opening 4 and a sucking operation for sucking the cleaning liquid L through the suction opening 44 are stopped at time when the developer pouring nozzle 3 passes the other end of the wafer W. Then, a state where the wafer W coated with the liquid film of the developer D is held for, for example, a predetermined time for a static development process. Parts of the resist film dissolve in the developer and the remaining parts of the resist film form a mask pattern. The discharge operation for discharging the developer D through the developer pouring nozzle 5 is stopped upon the passage of the developer pouring nozzle 5 past the other end of the wafer W and then the developer pouring nozzle 5 is moved further forward to a waiting position.

As shown in FIG. 6C, upon the completion of the static development process, the operations for discharging the cleaning liquid L through the discharge opening 4 and sucking the liquids through the suction opening 44 are resumed to form a liquid seal by producing a liquid flow as mentioned above. Then, the rinsing liquid pouring nozzle 6 is moved to the pouring starting position. Subsequently, the rinsing liquid R is discharged through the discharge opening 60 and, at the same time, the rinsing liquid pouring nozzle 6 is moved from a first end of the wafer W toward a second end of the wafer W diametrically opposite the first end. The developer remaining on the surface of the wafer W is replaced with the rinsing liquid R and the wafer W is thus cleaned. Most of the rinsing liquid R, similarly to the developer D, drops along the outer circumference of the annular member 3. A little of the rinsing liquid R dripped from the wafer W seeps into the space between the wafer W and the annular member 3 by, for example, capillary. The rinsing liquid R seeped into the space is sucked together with the cleaning liquid L through the suction opening 44 as shown in FIG. 8. If the developer D remaining on the wafer W cannot be satisfactorily replaced with the rinsing liquid R or the surface of the wafer W cannot be satisfactorily rinsed by one rinsing cycle, the rinsing liquid pouring nozzle 6 may be moved from the second end toward the first end of the wafer W or the rinsing liquid pouring nozzle 6 may be reciprocated several times, for example twice or three times. After the completion of the rinsing operation, the discharge operation for discharging the rinsing liquid R through the rinsing liquid pouring nozzle 6 is stopped and the rinsing liquid pouring nozzle 6 advanced further beyond the second end to a waiting position. The rinsing liquid pouring nozzle 6 is held at the waiting position.

For example, as shown in FIG. 6(d), the discharge operation for discharging the cleaning liquid L (sealing liquid) through the discharge opening 4 is stopped and all the cleaning liquid L is sucked off through the suction opening 44 and the drying gas is jetted through the gas jetting holes 23. The jetted drying gas spreads radially outward in the space between the upper end surface of the annular member 3 and the back surface of the wafer W to dry the back surface of the wafer W and the upper end surface of the annular member 3. The drying gas flows also along the circumferential side surface of the wafer W to dry the same.

Subsequently, the suction nozzle 63 is located at a suction starting position at a height, for example, between 0.1 and 5 mm from the surface of the wafer W and slightly outside the first end of the wafer W. Then, for example, as shown in FIG. 6(e), the suction means 66 produces a negative pressure in the suction opening 64 and the suction nozzle 63 is moved from the first end of the wafer W toward the second end of the wafer W. Consequently, the rinsing liquid R remaining on the surface of the wafer W is sucked up through the suction opening 64 to dry the surface of the wafer W. If the rinsing liquid R remaining on the wafer W cannot be satisfactorily removed by one suction cycle, the suction nozzle 63 may be moved from the second end toward the first end of the wafer W or the suction nozzle 63 may be reciprocated several times, for example twice or three times. After the completion of the suction operation, the suction operation for sucking up the rinsing liquid R through the suction nozzle 63 is stopped and the suction nozzle 63 is advanced further beyond the second end to a waiting position. Then, the gas jetting operation for jetting the drying gas through the gas jetting holes 23 is stopped, the suction of the wafer W by the vacuum chuck 2 is stopped, the wafer W is transferred from the vacuum chuck 2 to the wafer carrying means, and then the wafer carrying means carries the wafer W outside the developing device.

This embodiment produces a flow of the cleaning liquid flowing from the discharge opening 4 toward the suction opening 44 over the entire peripheral part of the back surface of the wafer W while the developer is being poured through the developer pouring nozzle 5 onto the surface of the wafer W and while the rinsing liquid is being poured through the rinsing liquid pouring nozzle 6 onto the surface of the wafer W, and sucks the developer and the rinsing liquid that flow from the surface to the back surface of the wafer W together with the cleaning liquid through the suction opening 44. Therefore, a seal can be formed by the flow of the liquid flowing radially outward over the entire peripheral part of the back surface of the wafer W, for example, even though the wafer W is not rotated to shake off the liquid. Consequently, the flow of the developer and the rinsing liquid from the surface of the wafer W to the back surface of the wafer W is suppressed and the back surface of the wafer W can be satisfactorily cleaned.

In this embodiment, the surfaces defining the outer groove 31 and the middle groove 32 are hydrophilic and the inner part is hydrophobic. Therefore, the cleaning liquid discharged through the discharge opening 4 is attracted by the hydrophilic part and is repelled outward by the hydrophobic inner part, and hence the inward flow of the liquid can be promoted. Consequently, the seal can be surely formed over the entire peripheral part of the back surface of the wafer W by the combined effect of the flow of the liquid and the suction through the suction opening 44. Since the hydrophilic part of the upper end surface of the annular member 3 extending outside the outer groove 31 suppresses the seepage of the developer and the rinsing liquid into the space between the wafer W and the annular member 3. The flow of the developer and the rinsing liquid to the back surface of the wafer W can be surely suppressed by the combined sealing effect of the hydrophobic part of the upper end surface of the annular member 3 and the seal.

In this embodiment, the second overflow ridge 35 is disposed on the inner side of the first overflow ridge 34, and the height of the upper end of the first overflow ridge 34 is lower than that of the upper end of the second overflow ridge 35. Therefore the cleaning liquid can be restrained from inward flow and the outward flow of the cleaning liquid can be promoted. Thus the seal can be surely formed over the entire peripheral part of the back surface of the wafer W by the combined effect of the suction through the suction opening 41 and the outward flow of the liquid. In this embodiment, the cleaning liquid discharge opening 4 is formed in the surface of the middle groove 32 sloping down outward, i.e., the cleaning liquid discharge opening 4 is formed in the inclined surface of the second overflow ridge 35 on the side of the suction opening 44. Therefore, the inward flow of the cleaning liquid can be suppressed and the outward flow of the cleaning liquid can be promoted. Thus the reverse flow of the cleaning liquid can be suppressed. Consequently, the seal can be surely formed over the entire peripheral part of the back surface of the wafer W by the combined effect of the suppression of the reverse flow of the cleaning liquid and the suction through the suction opening 44.

This embodiment sucks the rinsing liquid poured onto the surface of the wafer W after processing the wafer W by the development process and flowing from the surface to the back surface of the wafer W together with the cleaning liquid through the suction opening 44. Therefore, even if a part of the back surface of the wafer W on the outer side of the seal, i.e., a part of the back surface of the wafer W extending outside the outer groove 31, is wetted with the developer, the developer wetting that part of the back surface of the wafer W can be rinsed off with the rinsing liquid. Consequently, the back surface of the wafer W can be satisfactorily cleaned.

Figure 9:
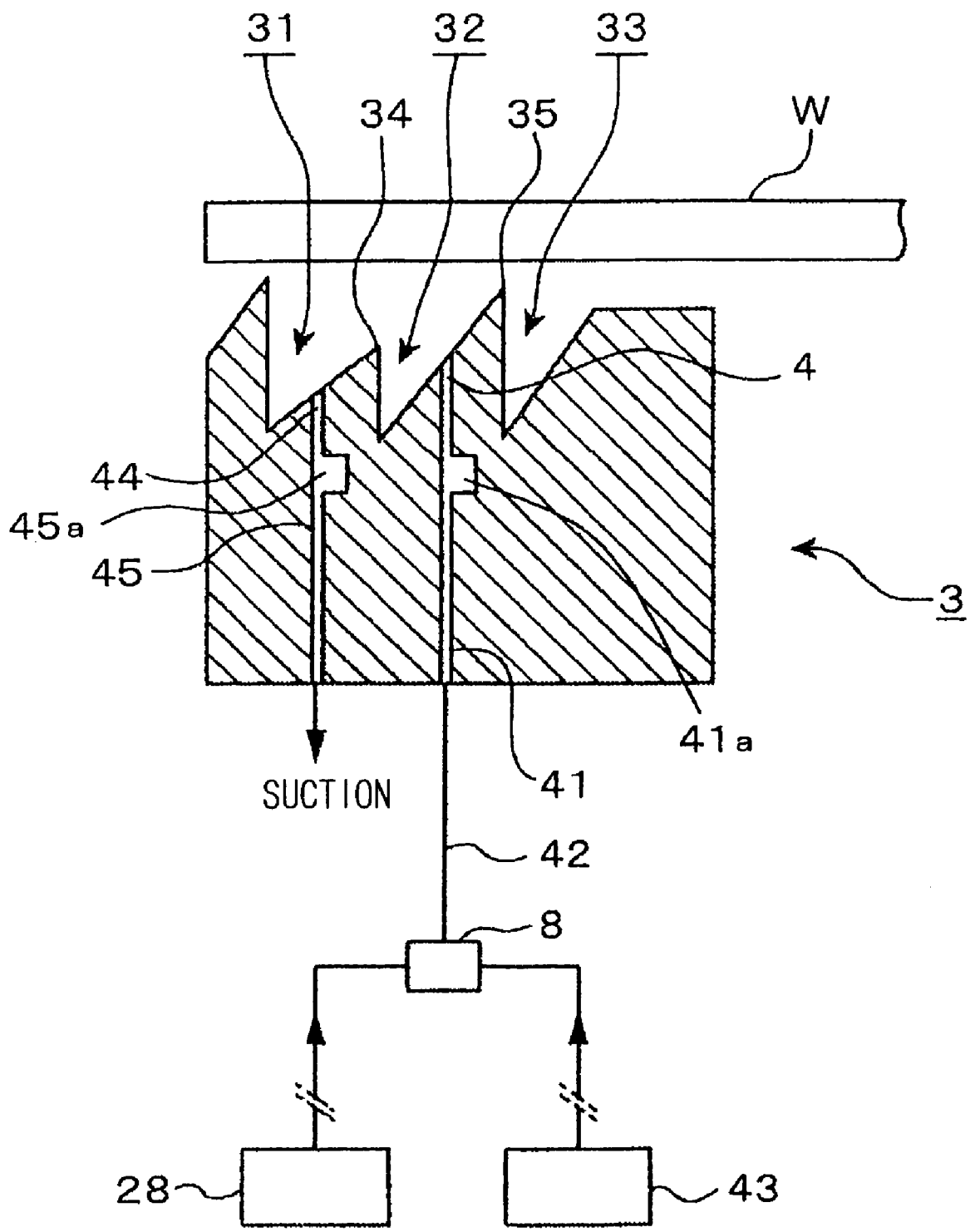
FIG. 9 is a view of assistance in explaining a third back surface cleaning unit.

Although the gas jetting holes 23 are formed in the vacuum chuck 2 in this embodiment, for example, the discharge opening 4 may be used also as the gas jetting holes 23 as shown in FIG. 9. When the discharge opening 4 is used also as the gas jetting holes 23, for example, the supply line 42 connected to the discharge opening 4 by the passage 41 is branched to connect the supply line 42 to both the cleaning liquid source 43 and the drying gas source 28 and a selector 8, such as a three-way valve, is operated to supply either of the cleaning liquid and the drying gas to the discharge opening 4. Effect of this arrangement is similar to that of the arrangement in the foregoing embodiment.

However, it would be wiser to supply the drying gas to the gas storage cavity 24 formed in the vacuum chuck 2 and to jet the drying gas radially outward through the gas jetting holes 23 opening in the circumference of the vacuum chuck 2 as shown in FIGS. 1 and 2 because the drying gas can be circumferentially uniformly distributed and the back surface of the wafer W can be more surely dried when the drying gas is jetted through the gas jetting holes 23. In this embodiment, the gas can be more surely uniformly spread circumferentially by resistance (pressure loss) against the flow of the gas through the space between the wafer W and the annular member 3.

Figure 10:
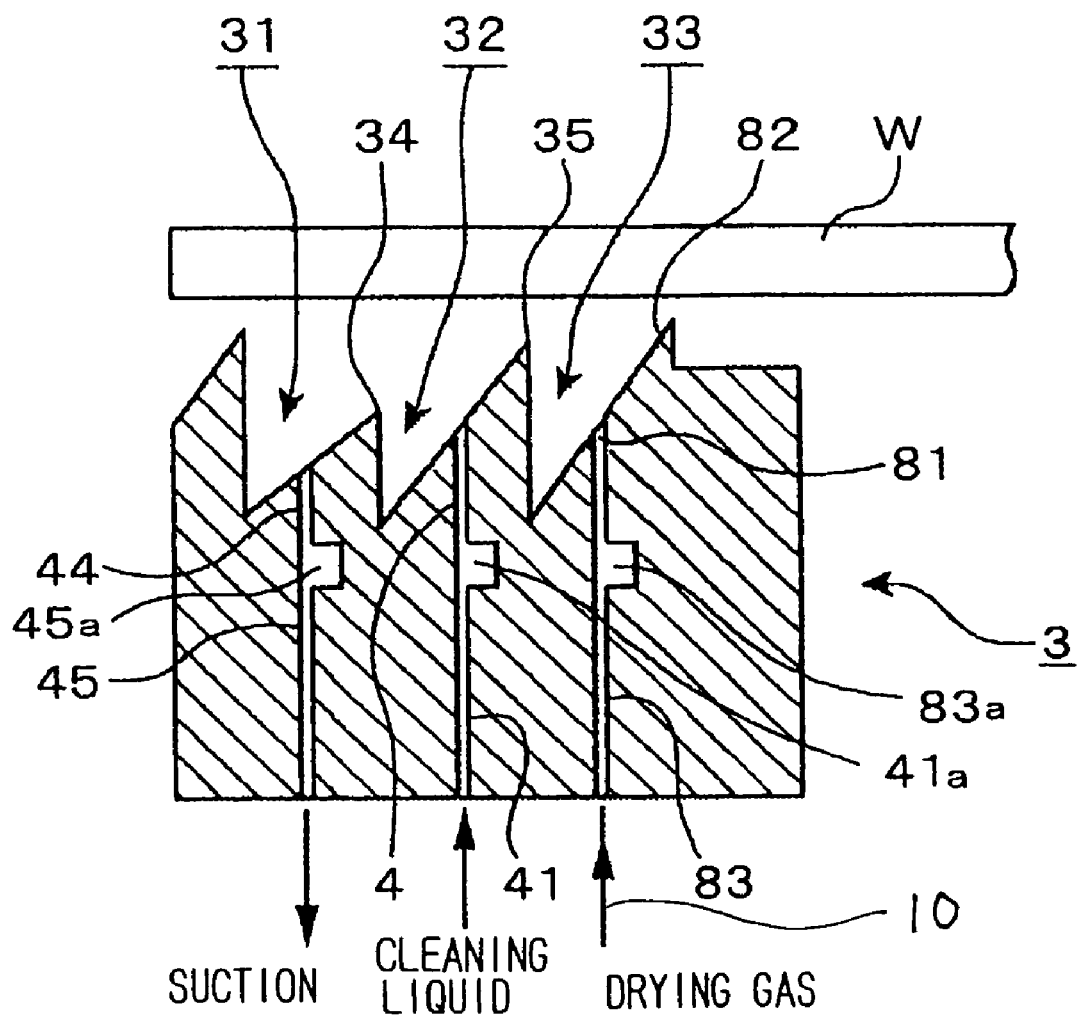
FIG. 10 is a view of assistance in explaining a fourth back surface cleaning unit.

For example, gas discharge openings 81 may be formed in the inclined inner surface of the inner groove 33 as shown in FIG. 10. It is preferable to form a third overflow ridge 82 on the inner side of the inner groove 33 to spread the drying gas more surely radially outward when the gas discharge openings 81 are formed in the inclined inner surface of the inner groove 33 as shown in FIG. 10. The third overflow ridge 82 is formed such that, for example, the upper end of the third overflow ridge 82 is at a height equal to or higher than that of the upper end of the second overflow ridge 34, i.e., the upper end of the third overflow ridge 82 is close to the back surface of the wafer W. In FIG. 10, indicated at 10—is a drying gas passage provided with a gas storage cavity 83*a*. The gas passage 10 is connected to the drying gas source 28 by a supply line, not shown. The effect of this arrangement is similar to that of the foregoing arrangement.

Figure 11:
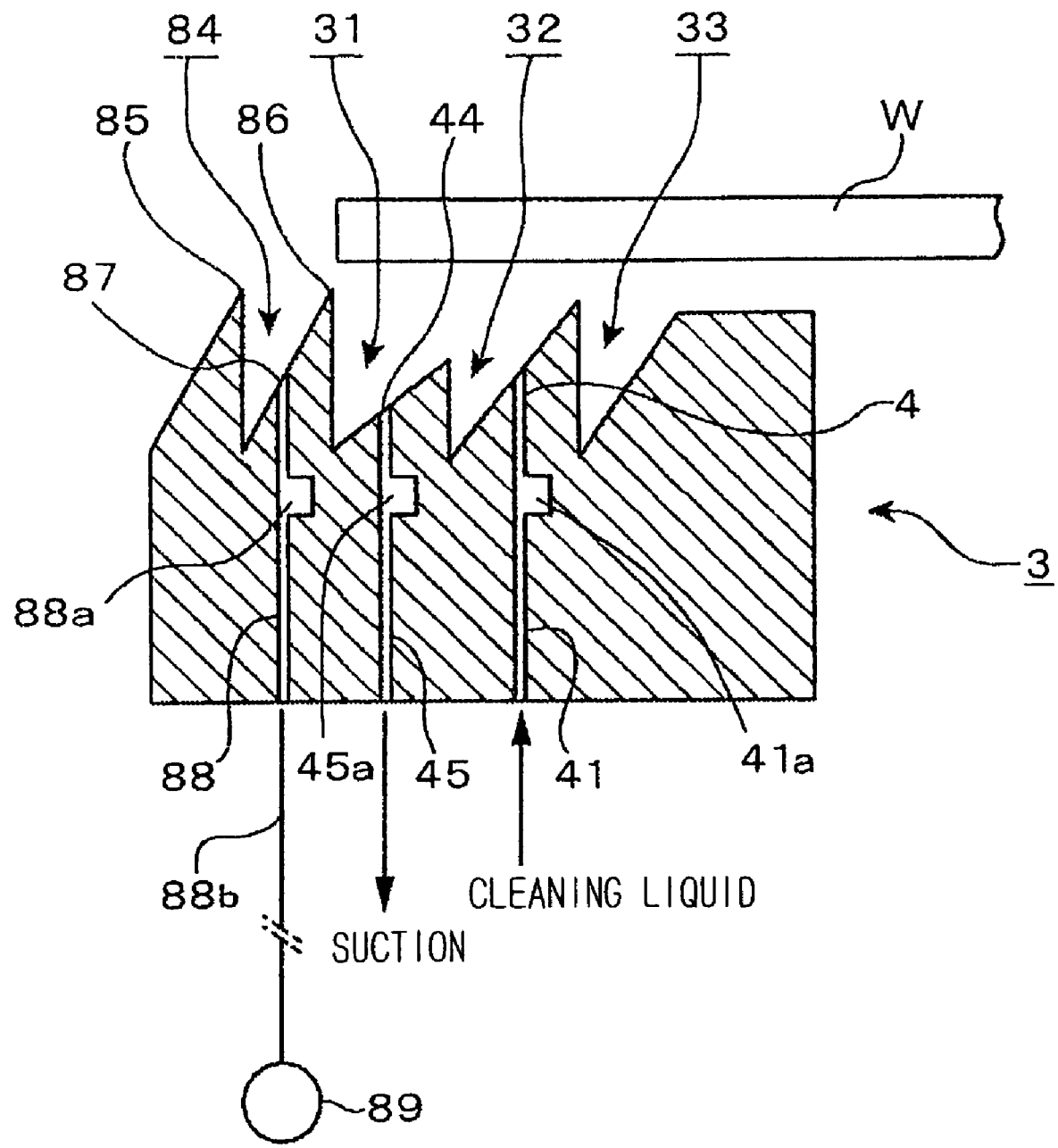
FIG. 11 is a view of assistance in explaining a fifth back surface cleaning unit.

A developing device, namely, a wet processing device, in a second embodiment according to the present invention will be described. The developing device in the second embodiment excluding an annular member 3 is identical with the developing device shown in FIGS. 1 and 2. The annular member 3 of the second embodiment will be described with reference to FIG. 11, in which parts like or corresponding to those of the annular member shown in FIGS. 1 and 2 are designated by the same reference characters and the description thereof will be omitted. The annular member 3 has a jutting part jutting out beyond the circumference of the wafer W. A groove 84 of a width, for example, between 1 and 5 mm is formed in the upper end surface of the jutting part. A fourth overflow ridge 85 and a fifth overflow ridge 86 are formed on the inner side and the outer side, respectively, of the groove 84. The fourth overflow ridge 85 and the fifth overflow ridge 86 are liquid stopping members for stopping the flow of the developer and the rinsing liquid into the space between the wafer W and the annular member 3. The fourth overflow ridge 85 and the fifth overflow ridge 86 are formed such that the distance between a plane containing the upper ends of the fourth overflow ridge 85 and the fifth overflow ridge 86, and a plane containing the back surface of the wafer W is between 0.1 and 3 mm.

A circumferential suction opening 87, namely, a second suction means, having the shape of, for example, a circular slit is formed in an inclined inner one of surfaces defining the groove 84. Liquids, such as the developer and the rinsing liquid, dripped from the surface of the wafer W are sucked into the suction opening 87. The suction opening 87 is connected to a passage 88 formed in the annular member 3 and provided with a fluid storage cavity 88*a*. A suction line 88*b*, such as a pipe, has one end connected to the passage 88 and the other end connected to a suction means 89, such as a suction pump or an ejector. The suction line 88*b* is provided with a suction regulator, not shown. The surfaces of the groove 84 are finished by a surface treatment in surfaces hydrophilic to the developer. Being hydrophilic signifies, for example, that the contact angle between a surface of a material having a hydrophilic nature and, for example, the developer is 50° or below. The suction opening does not need necessarily to be a circular slit. For example, a circular arrangement of suction holes of a small diameter arranged at short intervals may be used instead of the suction opening. Only the fourth overflow ridge 85 may be formed in a jutting part jutting out beyond the circumference of the wafer W instead of forming both the fourth overflow ridge 85 and the fifth overflow ridge 86 in the jutting part jutting out beyond the circumference of the wafer W.

This developing device carries out a process similar to that shown in FIG. 6 to process a wafer W. A negative pressure is produced in the suction opening while the developer is being poured through the developer pouring nozzle 5 onto the wafer W to suck the developer dripped from the wafer and while the rinsing liquid is being poured through the rinsing liquid pouring nozzle 6 onto the wafer W to suck the rinsing liquid dripped from the wafer W. The effect of this developing device is similar to that of the foregoing developing device. Since this developing device sucks the developer and the rinsing liquid dripped from the wafer W through the suction opening 85, the amount of those liquids to be received and stored temporarily is small and hence the capacity of the cup 21 may be small. Consequently, a floor space needed for installing the developing device is small. Since the developer and the rinsing liquid dripped from the surface of the wafer W are sucked quickly through the suction opening 85, mist of the developer and the rinsing liquid, which can be the source of particles, is rarely produced. The jutting part jutting out beyond the circumference of the wafer W and the part inside the jutting part of the annular member 3 of the developing device in the second embodiment may be separate members, namely, an outer member and an inner member, and the outer member may be moved vertically by a lifting mechanism. The effect of such an arrangement is similar to that of the foregoing arrangement.

According to the present invention, the liquid does not need necessarily to flow radially outward on the back surface of the wafer W. For example, the suction opening 44 may be formed on the inner side of the discharge opening 4 to make the liquid flow radially inward. The effect of such an arrangement is similar to that of the foregoing arrangement. Suction openings 44 may be formed on the outer side and on the inner side of the discharge opening 4 to make the liquid flow both radially outward and radially inward.

The present invention is not limited in its practical application to the developing device. The present invention is applicable to, for example, a cleaning device for cleaning the surface of a wafer W coated with a resist film with a cleaning liquid, such as pure water, and for drying the wafer before the wafer W is subjected to an immersion exposure process that forms a liquid layer over the surface of the wafer W for exposure. The substrate to be processed is not limited to a semiconductor wafer, but may be a LCD panel or a reticle substrate for a photomask.

Figure 12:
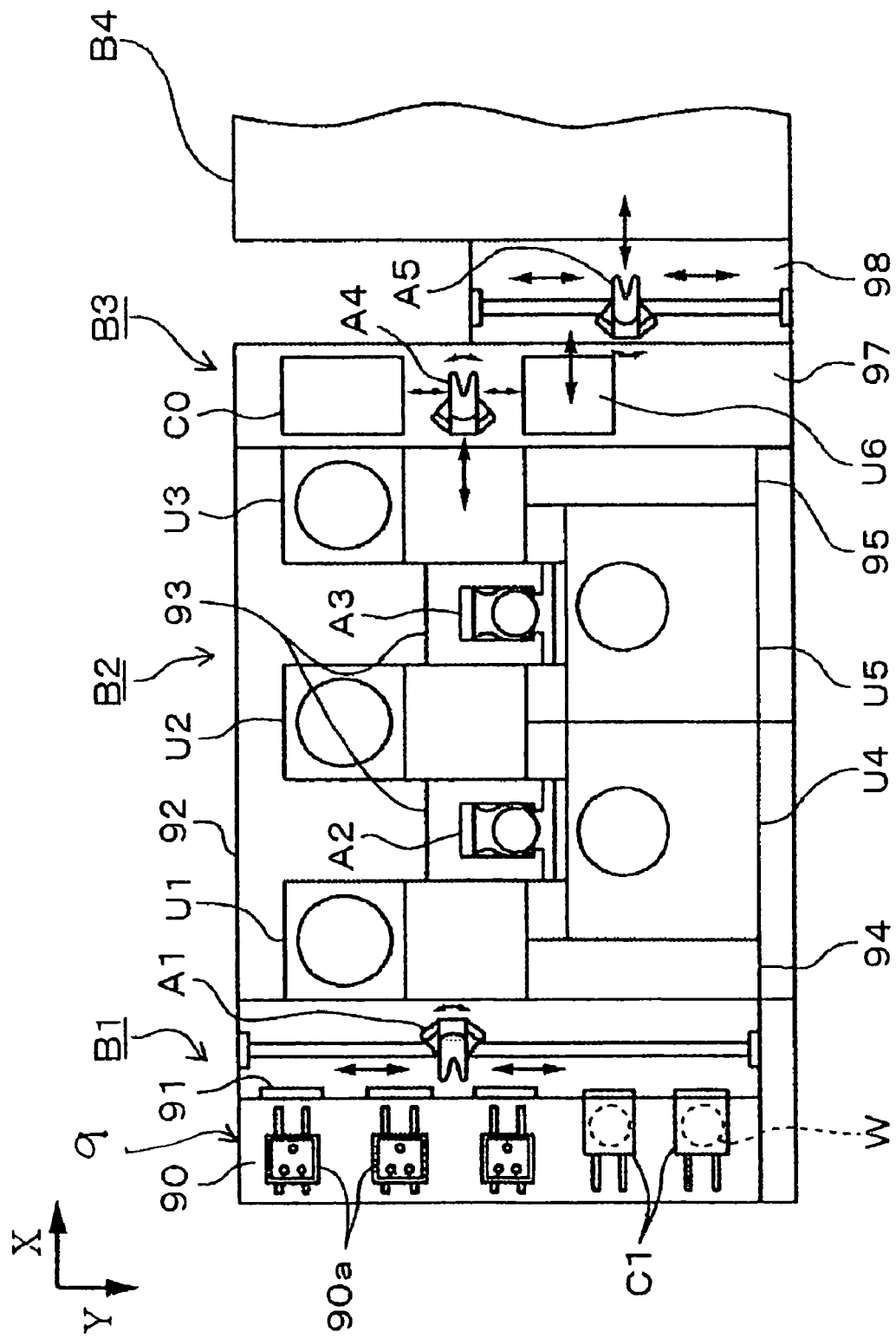
FIG. 12 is a plan view of a coating and developing system including the developing device.
Figure 13:
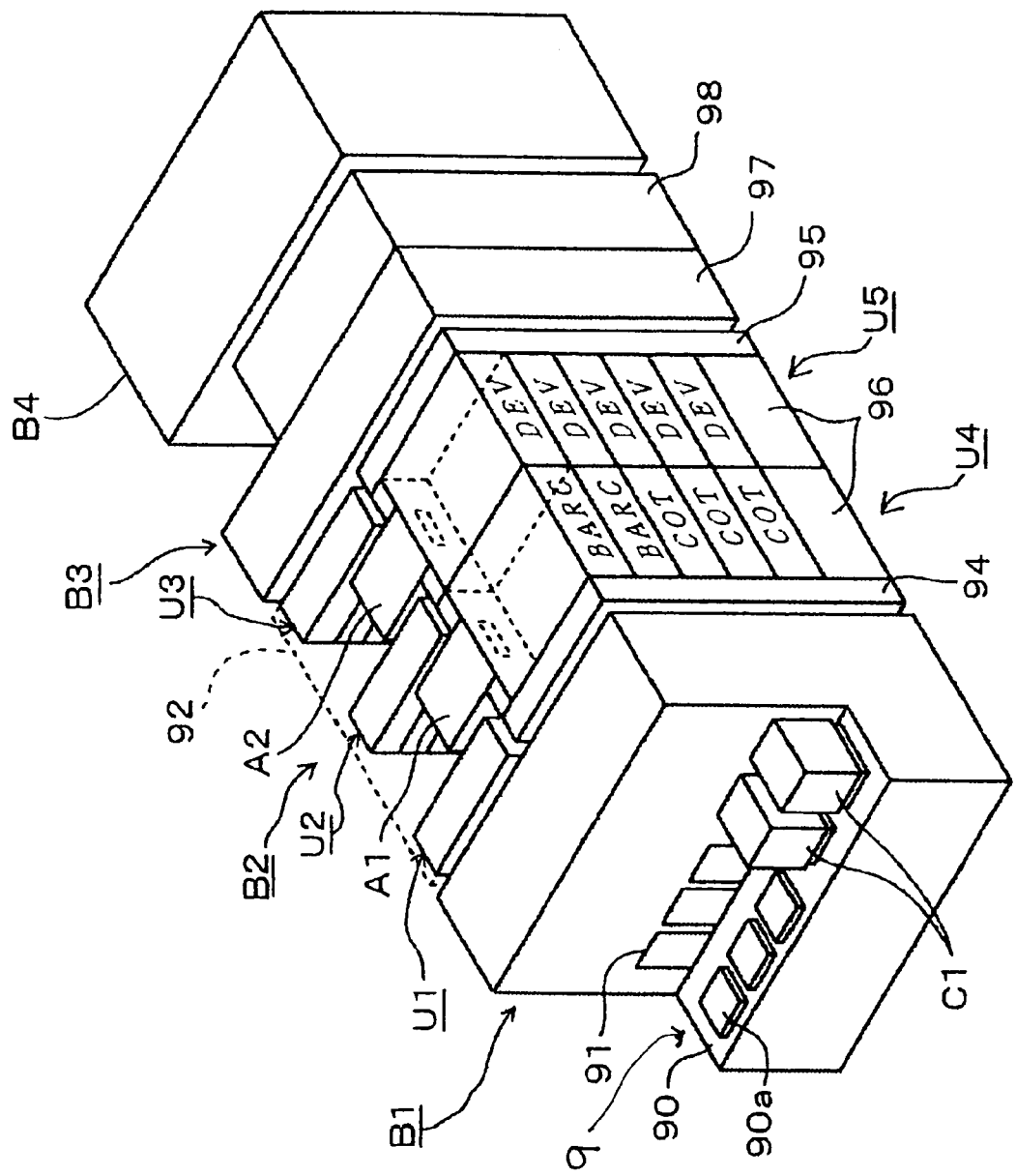
FIG. 13 is a perspective view of the coating and developing system.
Figure 14:
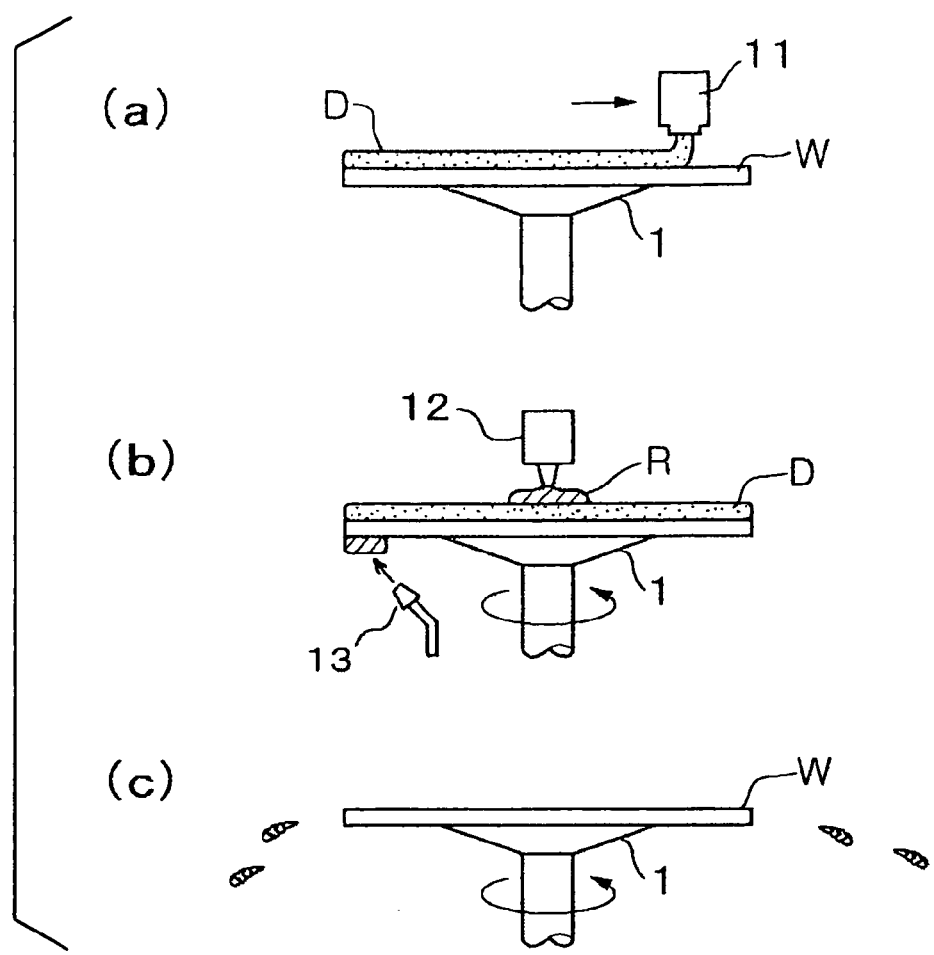
FIG. 14 is a view of assistance in explaining the steps of a known developing process.
Figure 15:
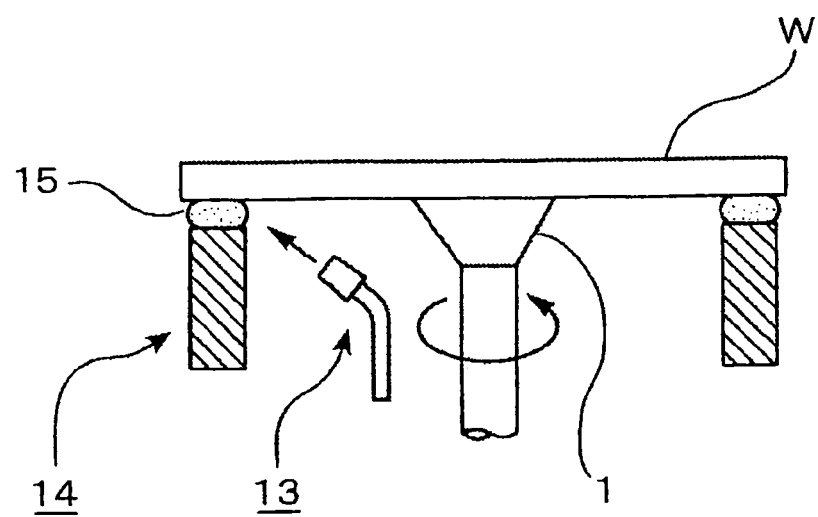
FIG. 15 is a view of assistance in explaining a known liquid seal forming method.

A coating and developing system provided with a developing device, namely, one of wet processing devices according to the present invention, will be briefly described with reference to FIGS. 12 and 13. Shown in FIGS. 12 and 13 are a carrier handling block B1 for receiving and sending out a sealed carrier C1 containing, for example, thirteen wafers W, namely, substrates. The carrier handling block B1 includes a carrier station 9 provided with a table 90 capable of supporting a plurality of carriers C1 thereon, gates 91 formed in a wall in front of the carrier station 9, and a transfer means A1 for taking out a wafer W through the gate 91 from the carrier C1.

A processing block B2 surrounded by a casing 92 is connected to the front end of the carrier handling block B1. The processing block B2 includes shelf units U1, U2 and U3 longitudinally arranged in that order from the side of the carrier handling block B1 and each formed by stacking heating-and-cooling devices in layers, and main carrying means A2 and A3 disposed between the shelf units U1 and U2 and between the shelf units U2 and U3, respectively. The shelf units U1, U2 and U3 and the main carrying means A2 and A3 are arranged longitudinally in a line. Wafer transfer openings are formed in the joints of the shelf units U1, U2 and U3 and the main carrying means A2 and A3. Thus a wafer W is free to move in the processing block B2 from the shelf unit U1 to the shelf unit U3. The main carrying means A2 and A3 are installed in spaces defined by side walls of the longitudinally arranged shelf units U1, U2 and U3, side walls of wet processing units U4 and U5 on the right side as viewed from the carrier handling block B1 and back walls, which serve as partition walls 93. In FIGS. 12 and 13, indicated at 94 and 95 are temperature-and-humidity adjusting units each including a temperature adjusting device for adjusting the temperatures of processing liquids to be used by the units, and a temperature-and-humidity adjusting unit provided with ducts.

The wet processing units U4 and U5 are built, for example, by stacking coating units COT, developing units DEV, namely, assemblies each including the foregoing developing device, and antireflection film forming units BARC in a plurality of layers, for example, in ten layers, on storage units 96 providing spaces to be used for supplying chemical solutions, such as coating liquids (liquid resists) and a developer. The shelf units U1, U2 and U3 are built by stacking various units for carrying out pretreatment processes and post-treatment processes to be carried out respectively before and after processes to be carried out by the wet processing units U4 and U5 in a plurality of layers, for example ten layers. Each of the shelf units U1, U2 and U3 includes heating units for heating (baking) a wafer W, cooling units for cooling a wafer W and such in combination.

An interface block B3 including, for example, a first transfer chamber 97 and a second transfer chamber 98 is disposed behind the shelf unit U3 of the processing block B2. An exposure system B4 is connected to the interface block B3. The interface block B3 is provided with two transfer means A4 and A5 for transferring a wafer@ between the processing block B2 and the Exposure system B4, a shelf unit U6 and a buffer carrier CO.

The flow of a wafer in this system will be described by way of example. The carrier C1 containing wafers W is delivered to and placed on the table 90. The gate 91 and the lid of the carrier C1 are opened and the transfer means A1 takes out a wafer W from the carrier C1. Then, the wafer W is transferred through a transfer unit, not shown, included in the shelf unit U1 to the main carrying means A2. The wafer W is processed by pretreatment processes preceding a coating process, such as an antireflection film forming process and a cooling process, by one of the devices of the shelf units U1 to U3. Then, a resist film is formed on the wafer W by the coating unit and the wafer W is processed by a heating process (baking process) by the heating unit, namely, one of the units of the shelf units U1 to U3. Then, the wafer W is cooled and is carried through the transfer unit of the shelf unit U3 to the interface block B3. In the interface block B3, the wafer W is carried by the transfer means A4 to the shelf unit U6, and is carried by the transfer means AS from the shelf unit U6 to the exposure system B4. The wafer W is processed by an exposure process by the exposure system B4. After the wafer W has been processed by the exposure process, the wafer W is carried along the reverse route to the main carrying means A2. Then, the wafer W is processed by the developing unit DEV to form a resist mask. Then, the wafer W is returned to the carrier C1 held on the table 90.

The invention claimed is:

1. A wet processing device comprising:
    a substrate holding device for holding a substrate in a horizontal position;
    a processing liquid pouring unit for pouring a processing liquid onto a surface of a substrate held by the substrate holding device;
    a cleaning liquid pouring nozzle for pouring a cleaning liquid onto the surface of the substrate held by the substrate holding device and processed by a wet process that pours the processing liquid onto the surface of the substrate;
    a cleaning liquid discharging unit provided with a discharge opening extending along an entire circumference of the substrate to discharge a cleaning liquid on a peripheral part of a back surface of the substrate held by the substrate holding device; and
    a first suction means provided with a suction opening extending along the entire circumference of the substrate to suck the cleaning liquid discharged on the peripheral part of the back surface of the substrate by the cleaning liquid discharging unit to produce a flow of the cleaning liquid flowing outward or inward along the back surface of the substrate so as to suck the liquid flowing from the surface to the back surface of the substrate together with the flow of the cleaning liquid; and
    wherein an overflow ridge higher than the discharge opening and the suction opening is formed between the cleaning liquid discharge opening of the cleaning liquid discharging unit and the suction opening of the first suction means, and a liquid flow in a space between the overflow ridge and the back surface of the substrate serves as a seal.

2. The wet processing device according to claim 1, wherein the cleaning liquid discharging unit corresponds to a part of the substrate inner than a part of the substrate corresponding to the first suction means, and the cleaning liquid flows radially outward.

3. The wet processing device according to claim 2, wherein a part, on a side of the suction opening, of a liquid guide area extending between the cleaning liquid discharge opening of the cleaning liquid discharging unit and the suction opening of the first suction means slopes down toward the suction opening.

4. The wet processing device according to claim 2, wherein a member in contact with the cleaning liquid discharged by the cleaning liquid discharging unit has an inner part made of a hydrophobic material and an outer part made of a hydrophilic material.

5. The wet processing device according to claim 2 further comprising a second suction means disposed at a position corresponding to a part of the substrate on an outer side of parts of the substrate corresponding to the cleaning liquid discharging unit and the first suction means to suck liquids dripped from the surface of the substrate.

6. The wet processing device according to claim 1 further comprising a controller for controlling the cleaning liquid discharging unit and a first suction means so that a flow of the cleaning liquid may be formed while the processing liquid is being poured onto the surface of the substrate and while the cleaning liquid is being poured onto the surface of the substrate.

7. The wet processing device according to claim 1 further comprising a gas blowing unit for blowing a drying gas against the back surface of the substrate after the cleaning liquid discharging unit has stopped discharging the cleaning liquid.

8. The wet processing device according to claim 7, wherein the gas blowing unit includes a hollow structure circular in a plane, serving as the substrate holding device for holding a substrate by a central part thereof, defining a buffer chamber and provided with gas jetting holes arranged along the circumference of the hollow structure to jet the gas radially outward.

9. The wet processing device according to claim 7, wherein the cleaning liquid discharge opening of the cleaning liquid discharging unit serves also as the gas jetting holes of the gas blowing unit.

10. The wet processing device according to claim 1, further comprising a stopping member, for stopping the flow of a liquid from the surface to the back surface of the substrate, disposed on the outer side of the cleaning liquid discharging unit and the first suction means.

11. A wet processing method comprising the steps of:
holding a substrate in a horizontal position;
processing the substrate held at a standstill by a wet process that pours a processing liquid onto a surface of the substrate;
pouring a cleaning liquid onto the surface of the substrate held at a standstill;
sucking a liquid flowing from the surface toward a back surface of the substrate together with a cleaning liquid by producing a flow of the cleaning liquid flowing outward or inward along the back surface of the substrate over an entire circumference of the substrate while the processing liquid is being poured onto the surface of the substrate and while the cleaning liquid is being poured onto the surface of the substrate; and
wherein the flow of the cleaning liquid overflows an overflow ridge close to the back surface of the substrate so as to form a liquid seal between the overflow ridge and the back surface of the substrate.

12. The wet processing method according to claim 11, wherein the flow of the cleaning liquid is produced by discharging a cleaning liquid on a peripheral part of the back surface of the substrate through a discharge opening extending along the entire circumference of the substrate, and sucking the cleaning liquid discharged on the peripheral part of the back surface of the substrate by a suction opening corresponding to the entire circumference of the back surface of the substrate.

13. The wet processing method according to claim 11, wherein the cleaning liquid flows outward.

14. The wet processing method according to claim 13 further comprising the step of sucking a liquid dripped from the surface of the substrate onto an area extending outside the suction opening for sucking the cleaning liquid while the flow of the cleaning liquid is produced.

15. The wet processing method according to claim 11 further comprising the step of blowing a drying gas against the back surface of the substrate after stopping discharging of the cleaning liquid.

16. The wet processing method according to claim 15, wherein the drying gas flows outward and is sucked through the suction opening.

17. The wet processing method according to claim 11, wherein the flow of a liquid from the surface to the back surface of the substrate is stopped by a stopping member disposed outside the flow of the cleaning liquid while the flow of the cleaning liquid is produced.

* * * * *